(12) United States Patent
Yuan et al.

(10) Patent No.: US 7,374,971 B2
(45) Date of Patent: May 20, 2008

(54) SEMICONDUCTOR DIE EDGE RECONDITIONING

(75) Inventors: Yuan Yuan, Austin, TX (US); Kevin J. Hess, Austin, TX (US); Chu-Chung Lee, Round Rock, TX (US); Tu-Anh Tran, Austin, TX (US); Alan H. Woosley, deceased, late of Austin, TX (US); by Donna Woosley, legal representative, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 53 days.

(21) Appl. No.: 11/110,283

(22) Filed: Apr. 20, 2005

(65) Prior Publication Data

US 2006/0237850 A1    Oct. 26, 2006

(51) Int. Cl.
*H01L 21/00* (2006.01)

(52) U.S. Cl. ........................ 438/113; 438/114

(58) Field of Classification Search ............... 438/113, 438/114, 33, 68, 458, 460, FOR. 386; 257/620, 257/797, 622, 623, 774
See application file for complete search history.

(56) References Cited

U.S. PATENT DOCUMENTS

| | | | |
|---|---|---|---|
| 5,950,070 A * | 9/1999 | Razon et al. ............... 438/113 |
| 6,028,347 A | 2/2000 | Sauber et al. | |
| 6,074,896 A * | 6/2000 | Dando .......................... 438/114 |
| 6,075,280 A * | 6/2000 | Yung et al. .................. 257/620 |
| 6,617,193 B1 * | 9/2003 | Toshio et al. ............... 438/106 |
| 6,847,102 B2 | 1/2005 | Gerber et al. | |
| 7,064,047 B2 * | 6/2006 | Fukasawa et al. .......... 438/460 |
| 7,223,673 B2 | 5/2007 | Wang et al. | |
| 2002/0127776 A1 * | 9/2002 | Nakajo et al. .............. 438/110 |
| 2005/0026397 A1 | 2/2005 | Daubenspeck et al. | |

* cited by examiner

*Primary Examiner*—W. David Coleman
*Assistant Examiner*—Khiem D Nguyen
(74) *Attorney, Agent, or Firm*—Daniel D. Hill; James L. Clingan, Jr.

(57) ABSTRACT

An integrated circuit has a semiconductor substrate and an interconnect layer that mechanically relatively weak and susceptible to cracks and delamination. In the formation of the integrated circuit from a semiconductor wafer, a cut is made through the interconnect layer to form an edge of the interconnect layer. This cut may continue completely through the wafer thickness or stop short of doing so. In either case, after cutting through the interconnect layer, a reconditioning layer is formed on the edge of the interconnect layer. This reconditioning layer seals the existing cracks and delaminations and inhibits the further delamination or cracking of the interconnect layer. The sealing layer may be formed, for example, before the cut through the wafer, after the cut through the wafer but before any packaging, or after performing wirebonding between the interconnect layer and an integrated circuit package.

10 Claims, 3 Drawing Sheets

SEMICONDUCTOR DIE EDGE RECONDITIONING

FIELD OF THE INVENTION

This invention relates generally to semiconductors and more particularly to semiconductor die edge reconditioning.

RELATED ART

Generally, during an integrated circuit manufacturing process, many identical circuits are formed on wafers of semiconductive material. The wafers are cut to produce semiconductor die, or integrated circuit chips, which are then packaged. The process of cutting, or singulating, the semiconductor die may cause edges of the semiconductor die to be damaged. The die edge damage may include cracks and delaminations. The cracks and delaminations may become worse during subsequent assembly processes and in various working environments. In some cases, the damage may lead to failure of some of the various layers that make up the circuits on the semiconductor die.

Efforts have been made to improve the die singulation process to eliminate the damage. These efforts include multi-step sawing and laser sawing. Unfortunately, the improved singulation processes typically only reduce the crack length or delamination size, and still leave very small cracks which may later become sources of larger cracks and delamination.

Therefore, a need exists to prevent the spread of cracks and further delamination at the edges of semiconductor die.

BRIEF DESCRIPTION OF THE DRAWINGS

The present invention is illustrated by way of example, and not by way of limitation, in the figures of the accompanying drawings and in which like reference numerals refer to like elements and in which.

DESCRIPTION OF A PREFERRED EMBODIMENT

Figure 1:
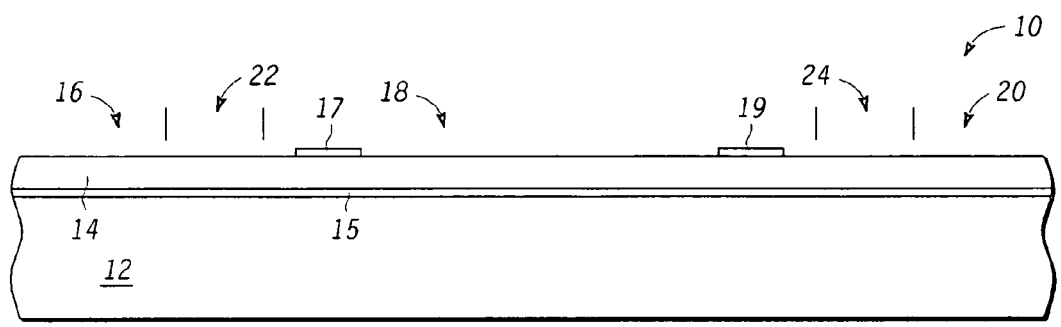
FIG. 1 illustrates a cross-section of a portion of a semiconductor wafer.

Generally, in one embodiment, the present invention provides a semiconductor die and method for reconditioning edges of the die for preventing the propagation of cracks and delamination in the edges of the semiconductor die.

Although cracks have been commonly observed during singulation in aluminum and copper technology where the dielectric material is not as fragile as the low-K dielectric, the cracks have not propagated to the extent that damage occurs to the functionality of the semiconductor die. The semiconductor die includes active circuitry and interconnect layers. Interconnect layers are made of interconnecting metals and insulating materials. Advanced copper technology uses low-K dielectric materials that have poor mechanical properties and weak adhesion. Mechanical stresses generated by a mismatch of the coefficient of thermal expansion (CTE) between the dielectric layer and metal layers can cause delamination of the semiconductor die. The propagation of die edge delamination is worse for integrated circuits having a low-K dielectric because of it's low material strength and it's low adhesive strength. Also, corners of the die are more susceptible to damage because they are farthest away from the central neutral point.

The amount of crack or edge delamination varies with the many types of features placed on a saw street and used during the semiconductor fabrication process. Features include lithography features, alignment keys, other in-process measurement features and probe test pads. Furthermore, different wafer fabrication factories and foundries utilize different patterns and shapes for these features on the saw street. Thus it is difficult to predict the amount of edge crack and delamination during singulation and further delamination propagation in different working conditions.

To prevent the propagation of cracks and further delamination, a reconditioning material is applied to the edge of the semiconductor die and covers at least the interconnect layers and active circuitry. The reconditioning material may comprise, for example, a polymer or a ceramic. The reconditioning material functions to recondition the die edges so that cracks and delaminations do not propagate. The reconditioning material may be applied at different process steps in the packaging flow. In one embodiment of the present invention, the semiconductor die is singulated using multiple saw cuts. After the first saw cut that extends below the interconnect layer, the resulting groove or cut is filled with the sealing material. Then the singulation is completed. In another embodiment, the semiconductor die is completely singulated before the sealing material is applied to the edge. The sealing material may be a material that applies a clamping, or compressive stress to the semiconductor die. In yet another embodiment, the sealing material is applied to buffer (absorb) the stress in the semiconductor die after the semiconductor die is mounted in a package substrate.

By applying a reconditioning material to the edge of the semiconductor die, failures due to crack propagation and delamination can be prevented. The disclosed embodiment is especially useful to prevent delamination in integrated circuits that use low-K dielectric materials or low modulus dielectric materials. Note that a low-K dielectric is defined as being is a dielectric having a dielectric constant around or below 3.0. Also, note that a low modulus dielectric is defined as being a dielectric having a mechanical modulus of less than or equal to about 80 giga-pascals (GPa).

FIG. 1 illustrates a cross-section of a portion of a semiconductor wafer 10. The semiconductor wafer 10 includes a semiconductor substrate 12 having active circuitry, dielectric layer15, and interconnect areas 14. The active circuitry and interconnect ares 14 are formed over a first major surface, or top, of the semiconductor substrate 12 using conventional integrated circuit processing steps, e.g.

complementary metal oxide semiconductor (CMOS). A plurality of bond sites 17 and 19 are formed over the interconnect layer 14. The active circuitry comprises transistors and other electrical circuit elements and the interconnect areas include layers of metal and insulating materials. The metal may be, for example, copper or aluminum, or a combination of copper and aluminum. A plurality of identical circuits is formed in the active circuitry and interconnect areas 14 on the wafer 10. For example, the portion of semiconductor wafer 10 includes identical circuits 16, 18, and 20, which when singulated and packaged will be identical finished integrated circuits. A predetermined amount of space, or saw streets, is provided between each of the circuits 16, 18, and 20 to allow the wafer to be diced into separate integrated circuits. On the wafer 10, saw streets, including saw streets 22 and 24, are provided between the identical circuits 16, 18, and 20 to be areas for singulation. For example, the saw street 22 is designated between identical circuits 16 and 18, and the saw street 24 is designated between identical circuit 18 and 20. The sawing may be done in a single step or in multiple steps.

Figure 2:
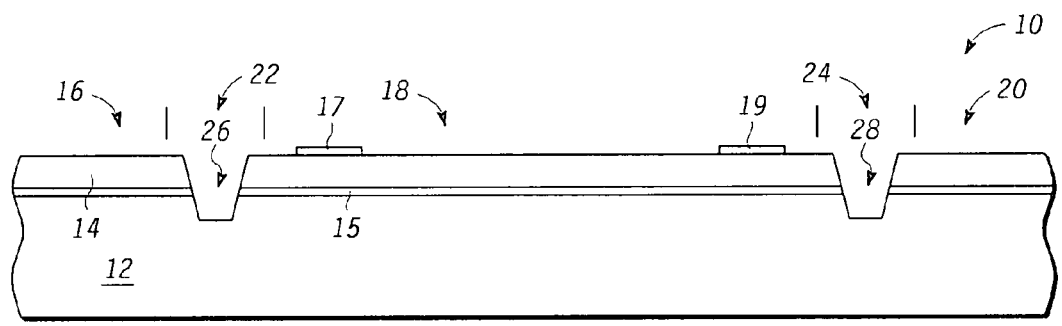
FIG. 2 illustrates a first saw cut in the semiconductor wafer of FIG. 1.

FIG. 2 illustrates a first saw cut 26 and a first saw cut 28 in the semiconductor wafer 10. Although only two cuts are illustrated in FIG. 2, one skilled in the art will realize that many more cuts will be made in wafer 10 to singulate the wafer into, for example, a thousand or more semiconductor die. The first saw cut extends from the surface of the wafer 10 through the interconnect layer 14 and partially into the substrate 12 to create a groove. Note that in FIG. 2 the cuts 26 and 28 are shown as being tapered as a natural result of the sawing process, but in other embodiments the cuts may be straight, stepped, or some other shape. Later in the process, as described below, more cuts will be made to complete the singulation.

Figure 3:
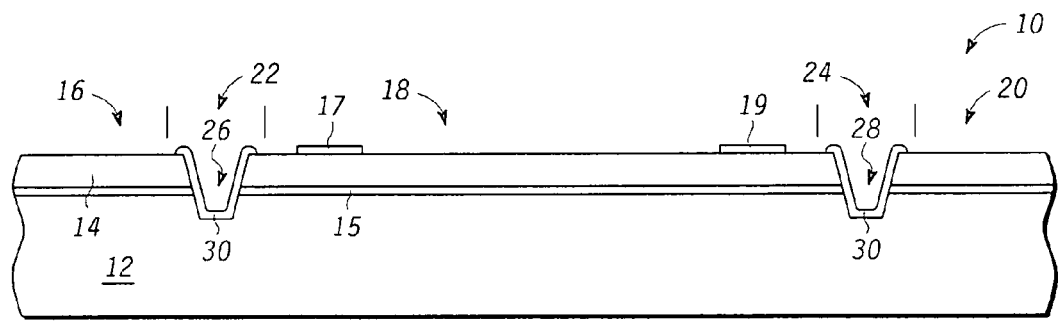
FIG. 3 illustrates coating the first saw cut of FIG. 2 with a sealing material in accordance with an embodiment of the present invention.

FIG. 3 illustrates coating the first saw cuts 26 and 28 of FIG. 2 with a sealing material 30 in accordance with one embodiment of the present invention. The purpose of the sealing material is to fill and seal the cracks resulting from the sawing process. Materials that are useful for sealing, or reconditioning, the die edges include polymers, glasses, or ceramics.

In the illustrated embodiment, the material is preferably a polymer resin with an as-cured coefficient of thermal expansion (CTE) that is matched to that of the material of the substrate ($2.6 \times 10^{-6}$ degree Centigrade (ppm/° C.)). The CTE of the sealing material 30 is between $3\text{-}10 \times 10^{-6}$ ppm/C.

Typical epoxy-based compounds achieve very low CTE by incorporating a high loading of inorganic filler material, for example, a silica filler. In the case of typical dispensing equipment, it would be difficult to meter an epoxy compound with a 70-80 percentage weight filler loading. Therefore, it is advantageous to add low molecular weight reactive diluents to enable flow. The incorporation of fillers with negative coefficients of expansion, such as beta eucryptite would also be advantageous by allowing a lower total filler content. Ideally, the resin system could be ultra-violet (UV) or photo cured to allow patterning. The requisite high filler loadings to achieve the low CTE value however, prevent the use of UV and photo-curing except in applications where a very thin coating of the resin formulation is applied.

Generally, to achieve low CTE for the matrix resin system, it would be preferred to use an epoxy with high aromatic content and no elastomer modification. The typical material characteristics of a CTE-matched coating resin are: modulus of greater than 10 giga-pascal (GPa), Glass transition temperature (Tg) greater than or equal to 150 degrees Celsius, a CTE of 3-10 ppm/° C., and volume shrinkage during cure of less than or equal 1.5 percent. Common thermosetting resins that can be formulated to meet these requirements include: epoxies with higher aromatic levels, polyimides and polyurethanes with higher crystallinity and short segments between reactive functionalities.

Polymers suitable for sealing die edges may also be applied by chemical vapor deposition. For example, parylene or poly(para-xylene) may be polymerized directly from the vapor phase, forming a conformal coating that fills and seals the die edges. Properties of parylene are: modulus of 2-5 GPa, CTE of 35 ppm/° C., and Tg of 100-120° C. An advantage of paraxylene in this application is the materials have improved moisture resistance as compared to epoxies and polyimides.

Alternate materials for sealing the die edges are glasses and ceramics. These materials may be applied to the die by any of the well known deposition processes, such as physical vapor deposition (PVD), chemical vapor deposition (CVD), or plasma-enhanced chemical vapor deposition (PECVD). For example, silicon dioxide or carbon-doped silicon dioxide glasses may be deposited by PECVD from vapor-phase organosilane precursors, such as tetraethoxy silane. The material characteristics of this material are: modulus of 70-90 giga-pascals and CTE of 3-20 ppm/° C.

Figure 4:
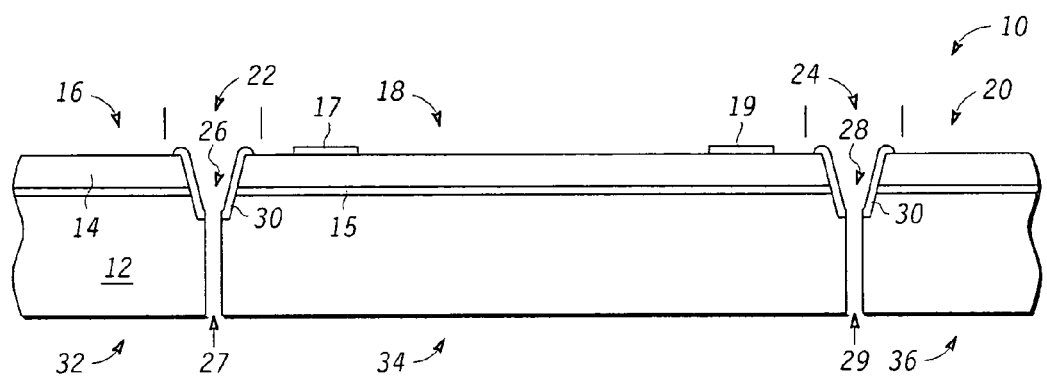
FIG. 4 illustrates a second saw cut through the sealing material and the semiconductor wafer of FIG. 3 in accordance with the present invention.

FIG. 4 illustrates second saw cuts 27 and 29 through the sealing material 30 and the rest of the semiconductor wafer 10. The singulated die 16, 18, and 20 then undergo conventional packaging processes (not shown). Note that only a portion of the cross-section of singulated die 16 and 20 are illustrated in FIG. 4. As illustrated in FIG. 4, the sealing material 30 seals the edge of the die from the top surface of interconnect layers 14 and extends partially along the semiconductor substrate 12. This is sufficient to prevent delamination propagation into the die. Note that in other embodiments, the sealing material may completely, or partially, fill the saw cuts 26 and 28 before the second saw cuts 27 and 29. Alternately, the die may be singulated before applying the sealing material. Also, in other embodiments, the sealing material may cover the entire edge from the first major surface to the bottom, or second major surface.

Figure 5:
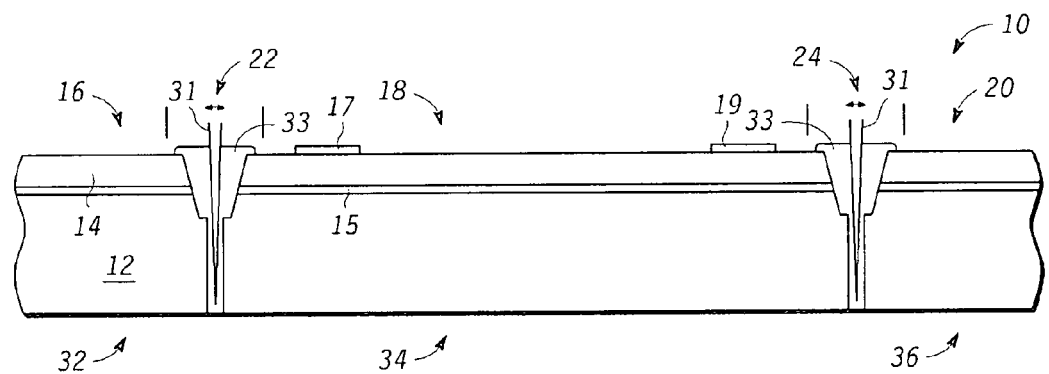
FIG. 5 illustrates applying a sealing material and singulating semiconductor die in accordance with another embodiment of the present invention.

FIG. 5 illustrates applying a sealing material 33 and singulating semiconductor die in accordance with another embodiment of the present invention. In the embodiment illustrated in FIG. 5, the first and second saw cuts, for example saw cuts 26 and 27 are completed to singulate the die. Then a split separator 31 is inserted into each of the saw cuts. As illustrated in FIG. 5, the split separator 31 may be formed from a single piece flat, relatively thin, material that has a hinge, or fold connection at the bottom. Ideally, the separator material would adhere only loosely to the sealing material to facilitate removal of the separator from the sealed die later in the process. A plurality of the split separators 31 may be formed in the shape of a grid to match the saw streets on wafer 10. The grid of split separators 31 have openings approximately the same dimensions as the semiconductor die. While the split separator 31 is inserted between the die, the sealing material 33 is applied to the saw cuts on both sides of the split separator 31. After the sealing material 33 cures, the split separator sides are spread apart, or snapped, to cause the die to separate from each other. Alternately, the split separator 31 can be cut at the bottom to singulate the die. Note that half of the split separator 31 remains attached to the die after singulation. Also, preferably the sealing material 33 covers the edge of the die from a top surface to a bottom surface of the die.

Figure 6:
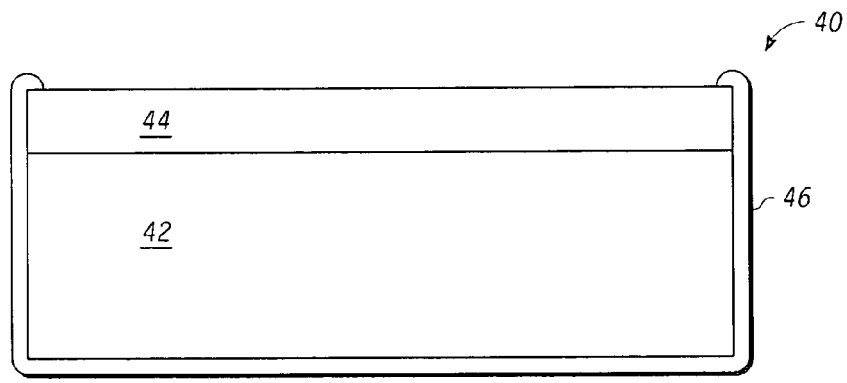
FIG. 6 illustrates applying a clamping material to the edges of a semiconductor die in accordance with another embodiment of the present invention.

FIG. 6 illustrates applying a clamping material 46 to the edges of a semiconductor die 40 in accordance with another embodiment of the present invention. The semiconductor die is singulated using a conventional singulation technique. The semiconductor die 40 includes a semiconductor substrate 42. A plurality of interconnect layers and active circuitry 44 is formed on one surface of the semiconductor substrate 42. A clamping material 46 is applied to the entire edge of the semiconductor die 40, and optionally to the bottom of the die as illustrated in FIG. 6. In the illustrated embodiment, the clamping material 46 is applied to a thickness of 50 micrometers (um) or more. In other embodiments, the thickness may be different. The clamping material 46 is applied to the die surfaces and generates a compressive stress on the die by the mechanism of cure shrinkage and/or CTE-based dimensional change upon cooling from the curing temperature. This pre-applied compressive stress on the die will reduce the tensile stress at the die edges which are prone to damage. The compressive loading on the die also holds the material interfaces at the die edge together, preventing any delamination of the weaker adhering layers from initiating or propagating further.

The material used for the clamping material 46 is a thermosetting polymer that is dispensed and cured over the outer edges and/or surfaces of the die either after singulation but before die attach to the package substrate or after die attach and before the final encapsulation. The objective of sealing as illustrated in FIG. 6 is to pre-stress the die with a compressive anchoring layer. The compressive forces applied to the die edges are developed by the curing and/or the thermal shrinkage of the polymer coating and by contraction from cooling.

The polymer coating material will preferably have the following characteristics: a modulus greater than or equal to 10 GPa, a Tg greater than or equal to 150 degrees Celsius, a CTE of 10-30 ppm/° C., and a volume shrinkage during cure of greater than or equal to 1.5 percent. Common resins that can be formulated to meet these requirements include epoxies incorporating higher aromatic levels and densities of reactive functionality, polyimides and bismaleimides, polyurethanes, and polycyanurates with higher crystallinity and crosslink levels.

When the clamping material 46 is applied, compressive stress is later superposed with the die stress in the packaged application resulting in a die having reduced tensile stress or even a compressive stress state, thus preventing delamination at the die edges. By application of the clamping material 46, some additional beneficial sealing of the die edges may also occur.

Figure 7:
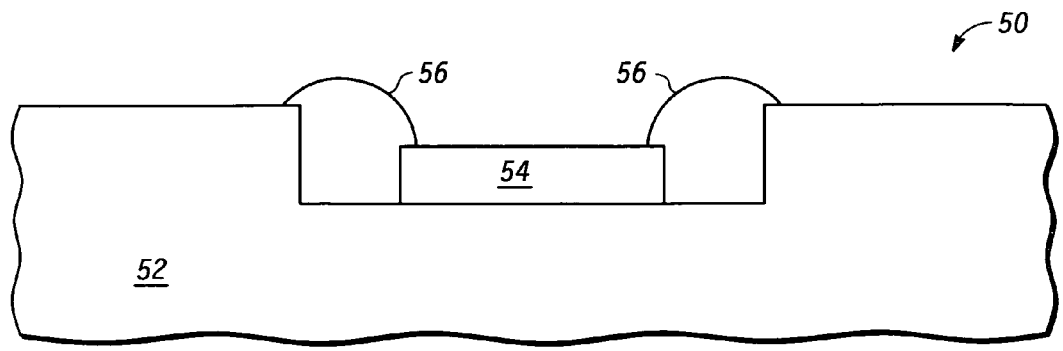
FIG. 7 illustrates a semiconductor die mounted on a substrate.

FIG. 7 illustrates a semiconductor device 50 having a semiconductor die 54 mounted on a package substrate 52 in accordance with another embodiment of the present invention. The semiconductor die 54 includes active circuitry and interconnect layers as described above for the previously discussed embodiments. A conventional die attach material (not shown) is used to attach die 54 to substrate 52. The package substrate 52 is a conventional multi-layer printed circuit board type, and in the illustrated embodiment includes a cavity for positioning the die 54. However, in other embodiments, the substrate 52 may not have a cavity. A plurality of bond wires 56 extend from bond sites on the die 54 to sites on the package substrate 52. The bond wires are used to electrically connect the die 54 to the substrate 52.

Figure 8:
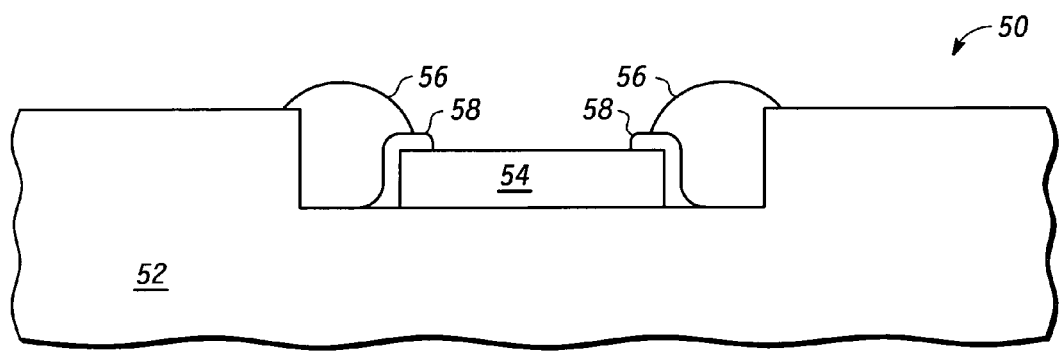
FIG. 8 illustrates applying a buffer material to edges of the semiconductor die in accordance with an embodiment of the present invention.

FIG. 8 illustrates a buffer material 58 applied to the edges of the semiconductor die 54 of FIG. 7. The buffer material 58 is cured, or at least partially cured, before completing the encapsulating process. The purpose of the this type of reconditioning layer is to provide a buffer layer that can absorb the mechanical stresses generated during packaging and during the intended application. The mechanical stresses may include, for example, curing/hardening of encapsulation material, and by package thermal cycling during operation. The mechanical energy is transferred to the buffer material 58 which is elastomeric and therefore deforms and absorbs the stress. After curing of the encapsulation resin 60 of FIG. 8, which may be, for example, a "glob top" encapsulant, mechanical stresses generated due to CTE mismatch between the encapsulant and the die are buffered.

The buffer material 58 is formulated as an elastomeric or elastomer-modified polymer. The preferred material characteristics of the polymer are: a modulus of less than or equal to 5 GPa, a CTE of 20-70 ppm/° C., a Tg of greater than or equal to 100 degrees Celsius, and good adhesion to epoxy glob top encapsulant, copper, and gold. Common resins that can be formulated to meet these requirements include: polyurethanes, polyimides, polyester or vinylester resins systems with rubber or siloxane modifiers, silicones, and epoxies with low aromatic content and high level of polysiloxane modifiers.

Figure 9:
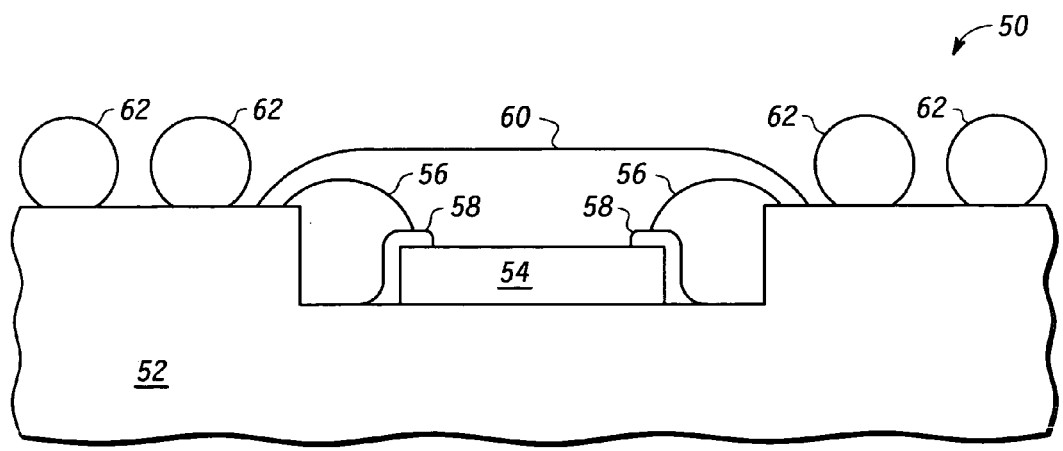
FIG. 9 illustrates a finished semiconductor device in accordance with an embodiment of the present invention.

FIG. 9 illustrates a finished semiconductor device in accordance with an embodiment of the present invention. After the buffer material 58 is cured, or at least partially cured, the packaged semiconductor device 50 is completed by adding an encapsulant 60 over the die 54 and bond wires 56. A plurality of conventional solder balls are added to the illustrated embodiment for connection to a printed circuit board (PCB). Note that even though a ball grid array (BGA) package is illustrated in FIG. 9, other package types can be used with the present invention.

While the invention has been described in the context of a preferred embodiment, it will be apparent to those skilled in the art that the present invention may be modified in numerous ways and may assume many embodiments other than that specifically set out and described above.

Accordingly, it is intended by the appended claims to cover all modifications of the invention which fall within the true scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making an integrated circuit, comprising:
   providing a semiconductor wafer having a major surface;
   forming active circuitry on the major surface of the semiconductor wafer;
   forming a dielectric layer over the active circuitry;
   forming an interconnect layer over the dielectric layer;
   forming a plurality of bond sites over the interconnect layer;
   performing a cutting operation to form a plurality of grooves through the interconnect layer, the dielctric layer and partially through the semiconductor wafer;
   applying a sealing material to coat the inside of each of the plurality of grooves, wherein the sealing material is not applied over a substatial portion of the major surface of the semiconductor wafer; and performing a separating operation to separate the semiconductor wafer into a plurality of singulated integrated circuit die, wherein the separtaing operation begfins in the plurality of grooves after the sealing material is applied, and wherein the sealing material remains on a side of the groove after the separating operation.

2. The method of claim 1, wherein the step of applying the sealing material further comprises applying the sealing material around the bond site.

3. The method of claim 1, further comprising:
   placing an integrated circuit die of the plurality of singulated integrated circuit die in a cavity of an integrated circuit package substrate; and
   wirebonding from a bond site of the plurality of bond sites to the integrated circuit package.

4. The method of claim 1, wherein performing a cutting operation further comprises performing a sawing operation to form the plurality of grooves.

5. The method of claim 1, wherein performing a separating operation further comprises performing a sawing operation beginning in the plurality of grooves.

6. The method of claim 1, wherein applying a sealing material further comprises applying a sealing materail comprising one of an epoxy, a polymer, a glass, or a ceramic.

7. A method of forming an integrated circuit, comprising:
   providing a semiconductor wafer;
   forming active circuitry on the semiconductor wafer;
   forming a dielectric layer over the active circuitry;
   forming an interconnect layer over the dielectric layer;
   forming a plurality of bond sites over the interconnect layer;
   cutting through the interconnect layer, the dielctric layer, and partially through the semiconductor wafer to form a groove;
   coating the groove with a sealing material;
   cutting completely through the semiconductor wafer beginning in the groove to form a plurality of semiconductor die from the semiconductor wafer, wherein cutting completely through the semiconductor wafer occurs after the groove is coated with the sealing material, and wherein the sealing material remains on a side of the groove after cutting completely through the semiconductor wafer; and
   placing a semiconductor die of the plurality of semiconductor die in a cavity of a package substrate.

8. The method of claim 7, wherein cutting completely through the semiconductor wafer further comprises using a separate each die from the wafer, wherein the separator is placed in the groove and functions to mechanically separate the plurality of semiconductor die from each other.

9. The method of claim 7, wherein the groove with a sealing material further comprises coating the groove with a sealing material comprising one of an epoxy, a polymer, a glass, or a ceramic.

10. The method of claim 7, wherein coating the groove with a sealing material further comprises coating the groove with a sealing material that applies a compressive stress to the semiconductor die.

* * * * *

UNITED STATES PATENT AND TRADEMARK OFFICE
CERTIFICATE OF CORRECTION

PATENT NO.         : 7,374,971 B2                                              Page 1 of 1
APPLICATION NO. : 11/110283
DATED               : April 20, 2005
INVENTOR(S)       : Yuan Yuan It is certified that error appears in the above-identified patent and that said Letters Patent is hereby corrected as shown below:

In Column 6, Line 62, Claim No. 1:

Change "dielctric" to --dielectric--

In Column 7, Line 3, Claim No. 1:

Change "begfins" to --begins--

In Column 7, Line 23, Claim No. 6:

Change "materail" to --material--

In Column 8, Line 1, Claim No. 7:

Change "dielctric" to --dielectric--

In Column 8, Line 17-18, Claim No. 8:

Change "using a separate each die" to --using a separator to separate each die--

In Column 9, Line 21, Claim No. 9:

Change "wherein the groove" to --wherein coating the groove--

Signed and Sealed this

Twenty-sixth Day of August, 2008

JON W. DUDAS
*Director of the United States Patent and Trademark Office*

UNITED STATES PATENT AND TRADEMARK OFFICE
CERTIFICATE OF CORRECTION

PATENT NO.        : 7,374,971 B2                                           Page 1 of 1
APPLICATION NO. : 11/110283
DATED             : May 20, 2008
INVENTOR(S)       : Yuan Yuan It is certified that error appears in the above-identified patent and that said Letters Patent is hereby corrected as shown below:

In Column 6, Line 62, Claim No. 1:

Change "dielctric" to --dielectric--

In Column 7, Line 3, Claim No. 1:

Change "begfins" to --begins--

In Column 7, Line 23, Claim No. 6:

Change "materail" to --material--

In Column 8, Line 1, Claim No. 7:

Change "dielctric" to --dielectric--

In Column 8, Line 17-18, Claim No. 8:

Change "using a separate each die" to --using a separator to separate each die--

In Column 9, Line 21, Claim No. 9:

Change "wherein the groove" to --wherein coating the groove--

This certificate supersedes the Certificate of Correction issued August 26, 2008.

Signed and Sealed this

Twenty-third Day of September, 2008

JON W. DUDAS
*Director of the United States Patent and Trademark Office*